(12) United States Patent
Kang et al.

(10) Patent No.: US 7,298,189 B2
(45) Date of Patent: Nov. 20, 2007

(54) DELAY LOCKED LOOP CIRCUIT

(75) Inventors: Yong Gu Kang, Chungcheongbuk-do (KR); Jun Hyun Chun, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/965,985

(22) Filed: Oct. 15, 2004

(65) Prior Publication Data

US 2005/0242854 A1    Nov. 3, 2005

(30) Foreign Application Priority Data

Apr. 30, 2004   (KR) ..................... 10-2004-0030572

(51) Int. Cl.
*H03L 7/06* (2006.01)

(52) U.S. Cl. ...................... 327/158; 327/149

(58) Field of Classification Search ..................... None
See application file for complete search history.

(56) References Cited

U.S. PATENT DOCUMENTS

| 6,066,969 | A  | * | 5/2000  | Kawasaki et al. | .......... 327/156 |
| 6,342,796 | B2 | * | 1/2002  | Jung | .......... 327/141 |
| 6,437,619 | B2 | * | 8/2002  | Okuda et al. | .......... 327/158 |
| 6,492,852 | B2 | * | 12/2002 | Fiscus | .......... 327/158 |
| 6,509,776 | B2 | * | 1/2003  | Kobayashi et al. | .......... 327/277 |

* cited by examiner

*Primary Examiner*—Tuan T. Lam
*Assistant Examiner*—William Hernandez
(74) *Attorney, Agent, or Firm*—Ladas & Parry LLP

(57) ABSTRACT

The DLL circuit detects a frequency of an external clock signal and adjusts a coarse delay during a DLL circuit operation, thereby quickly terminating a feedback operation of the DLL circuit and having a reduced circuit area of a delay line. Therefore, the DLL circuit can be used for next generation high-integration and high-frequency memory devices such as DDR2 SDRAMs.

10 Claims, 5 Drawing Sheets

DELAY LOCKED LOOP CIRCUIT

BACKGROUND OF THE INVENTION

1. Field of the Invention

The present invention relates to a delay locked loop circuit, and more particularly to a delay locked loop circuit having an improved processing speed and a reduced area for elements of the circuit, so that the delay locked loop circuit can operate in a wide range of a frequency through.

2. Description of the Prior Art

As generally known in the art, a semiconductor memory device has a phase difference between an externally inputted clock (external clock) and an internal clock due to several causes. That is, a phase of the external clock is delayed due to line loading and a clock input buffer receiving the external clock inputted into the semiconductor memory device. Also, a phase of the external clock is delayed due to line loading, an output buffer which receives internal cell data in order to output the internal cell data to the outside of the semiconductor memory device, and other logic circuits. As described above, a phase delayed by circuits accommodated in the semiconductor memory device is called "skew". A delayed locked loop circuit compensates for a delay of such a phase.

Such a delayed locked loop circuit prevents occurrence of a phase difference between a clock and data, which are outputted to the outside of the semiconductor memory device from the inside thereof. Accordingly, the delayed locked loop circuit synchronizes a clock used in the semiconductor memory device with a chip-set clock and sends cell data to an external chip-set without errors. That is, in a data read operation, the delayed locked loop circuit equalizes a timing of an externally inputted clock with the timing at which data read from a cell in a semiconductor memory device pass through a data output buffer on the basis of the external clock.

In particular, since the delayed locked circuit used for high-speed synchronization memory devices such as DDR SDRAMs determines an operation frequency band of the memory devices and exerts serious influence on an operation time characteristic, the high-speed synchronization memory devices include a high-performance delay locked loop circuit having a wide frequency band and a low jitter characteristic.

FIG. 1 illustrates a block diagram of a typical delayed locked loop circuit.

As shown in FIG. 1, the delay locked loop circuit includes a clock buffer 101 for receiving external clock signals (CLK and CLKB), a delay line 102 for receiving an output signal (RCK (rising clock) or FCK (falling clock)) of the clock buffer 101, a clock divider 105 for dividing an output signal of the clock buffer 101, a clock divider 109 for dividing an output signal IRCK from among output signals IRCK and IFCK of the delay line 102, a replica delay part 108 for delaying an output signal of the clock divider 109 by a predetermined time td1+td2, a phase comparator 106 for comparing a phase of an output signal FBCLK outputted from the replica delay part 108 with a phase of an output signal REFLK of the clock divider 105, a delay control part 107 for controlling a delay time of the delay line 102 by receiving an output signal of the phase comparator 106, and a clock driver 103 for receiving the output signal IRCK or IFCK of the delay line 102. An output signal RCKDLL or FCKDLL of the clock driver 103 controls the operation of a data output driver 104.

As shown in FIG. 1, the CLK refers to an external clock signal, and the CLKB refers to an inverted external clock signal having a phase inverse to the CLK.

The clock buffer 101 is a buffer circuit for receiving the external clock signals CLK and CLKB and converting a voltage level of the clock buffer into a voltage level (e.g., CMOS level) used in a semiconductor device.

The delay line 102 is a circuit for delaying the output signal RCK or FCK of the clock buffer 101 by a predetermined time. Generally, the delay line 102 includes a plurality of unit delay circuits, and a delay time of the delay line 102 is controlled by the delay control part 107.

The clock driver 103 having a powerful driving force is a clock driving circuit which receives the output signal IRCK or IFCK of the delay line 103 and generates a driving signal for driving the data output driver 104.

The data output driver 104 outputs data to the outside thereof in response to the output signal RCKDLL or FCKDLL of the clock driver 103.

The clock divider 105 generates a predetermined reference clock by dividing a clock signal RCK or FCK outputted from the clock buffer 101 at the ratio of 1/n (generally, n may be '4', '8', '16', etc., as an integer).

The clock divider 109 is a circuit for dividing an output signal IRCK frequency of the delay line 102. Generally, the clock divider has the same circuit structure as the clock divider 105.

The replica delay part 108 is a delay circuit having a delay time tD1 and tD2 obtained by adding a delay time tD1 of the clock buffer 101 to a delay time tD2 of the data output driver 104.

The phase comparator 106 compares a phase of the output signal REFCLK of the clock divider 105 with a phase of a feedback signal, which is an output signal of the replica delay part 90. That is, the phase comparator 106 controls the delay control part 107 by calculating a delay time difference between tow signals REFCLK and FBCLK.

The delay control part 107 controls a delay time of the delay line 102.

For reference, as shown in FIG. 1, tCK denotes a period of the external clock, the RCK (rising clock) signal, which is the output signal of the clock buffer 101, corresponds to the external clock signal CLK, and the FCK (falling clock), which is the output signal of the clock buffer 101, corresponds to the external clock signal CLKB. The IRCK (internal rising clock) signal, which is the output signal of the delay line 102, is a delay signal of the signal RCK, and the IFCK (internal falling clock) signal, which is the output signal of the delay line 102, is a delay signal of the FCK signal.

As shown in FIG. 1, the clock divider 105 receives only the RCK signal from among the output signals of the clock buffer 101. Also, the clock divider 109 receives only the IRCK signal from among output signals of the delay line 102.

Hereinafter, a basic operation of the delay locked loop circuit will be described.

The phase comparator 106 compares a phase of the output signal REFCLK of the clock divider 105 with a phase of the output signal FBCK of the replica delay part 90, and sends a predetermined signal to the delay control part 107. The control part 107 controls the delay line 102 in such a manner that the delay line 102 adjusts a delay time in order to minimize a phase difference. The control procedure is repeated until the phase difference is removed.

However, a conventional delay locked loop circuit shown in FIG. 1 has the following problems.

1. It is necessary to increase the number of unit delay circuits included in the delay line 102 in order to operate the delay locked loop circuit in a wide frequency band.

2. If the number of the unit delay circuits is increased, an area occupied by the delay line 102 is large.

3. The more the number of the unit delay circuits is, the more the power consumption is.

SUMMARY OF THE INVENTION

Accordingly, the present invention has been made to solve the above-mentioned problems occurring in the prior art, and an object of the present invention is to provide a delay locked loop circuit having a fast locking function and a relatively reduced delay line area.

Another object of the present invention is to provide a delay locked loop circuit suitable for a wide frequency band.

Still another object of the present invention is to provide a delay locked loop circuit having a fast locking function by including a unit for detecting levels of frequencies (lengths of periods) of external clock signals (CLK and CLKB).

In order to accomplish this object according to an aspect of the present invention, there is provided a delay locked loop circuit comprising: a clock buffer for receiving an external clock signal; a delay selection part for receiving an output signal of the clock buffer, delaying the output signal by a predetermined time, and outputting the output signal; a delay line for receiving an output signal of the delay selection part, delaying the output signal by a predetermined time, and outputting the output signal; a first clock divider for dividing a frequency of the output signal of the clock buffer at the ratio of 1/n (n=a natural number of at least two) a second clock divider for dividing a frequency of the output signal of the delay line at the ratio of 1/n; a replica delay part for delaying an output signal of the second divider by a predetermined time; a phase comparator for comparing a phase of an output signal of the first divider with a phase of an output signal of the replica delay part; a delay controller for adjusting a delay time of the delay line in response to an output signal of the phase comparator; and a clock period detector for receiving the output signal of the first clock divider and the output signal of the replica delay part and outputting a first control signal group and a second control signal group, wherein the first control signal group is applied to the first clock divider and the second clock divider so as to delay signals applied to the first clock divider and the second clock divider, and the second control signal group is applied to the delay selection part so as to adjust a delay time of the delay selection part.

According to the present invention, when a frequency of the external clock signal is within a reference frequency range, the first clock divider and the second clock divider controlled by the first control signal group divide signals applied to the first clock divider and the second clock divider after delaying the signals by a first delay time. Also, when the frequency of the external clock signal is higher than the reference frequency range, the first clock divider and the second clock divider divide signals applied to the first clock divider and the second clock divider after delaying the signals by a second delay time shorter than the first delay time, and, when the frequency of the external clock signal is lower than the reference frequency range, the first clock divider and the second clock divider divide signals applied to the first clock divider and the second clock divider after delaying the signals by a third delay time longer than the first delay time.

According to the present invention, the higher the frequency of the external clock signal is as compared with the reference frequency range, the longer the delay time of the delay selection part determined by the second control signal group is, and the lower the frequency of the external clock signal is as compared with the reference frequency range, the shorter the delay time of the delay selection part determined by the second control signal group is.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
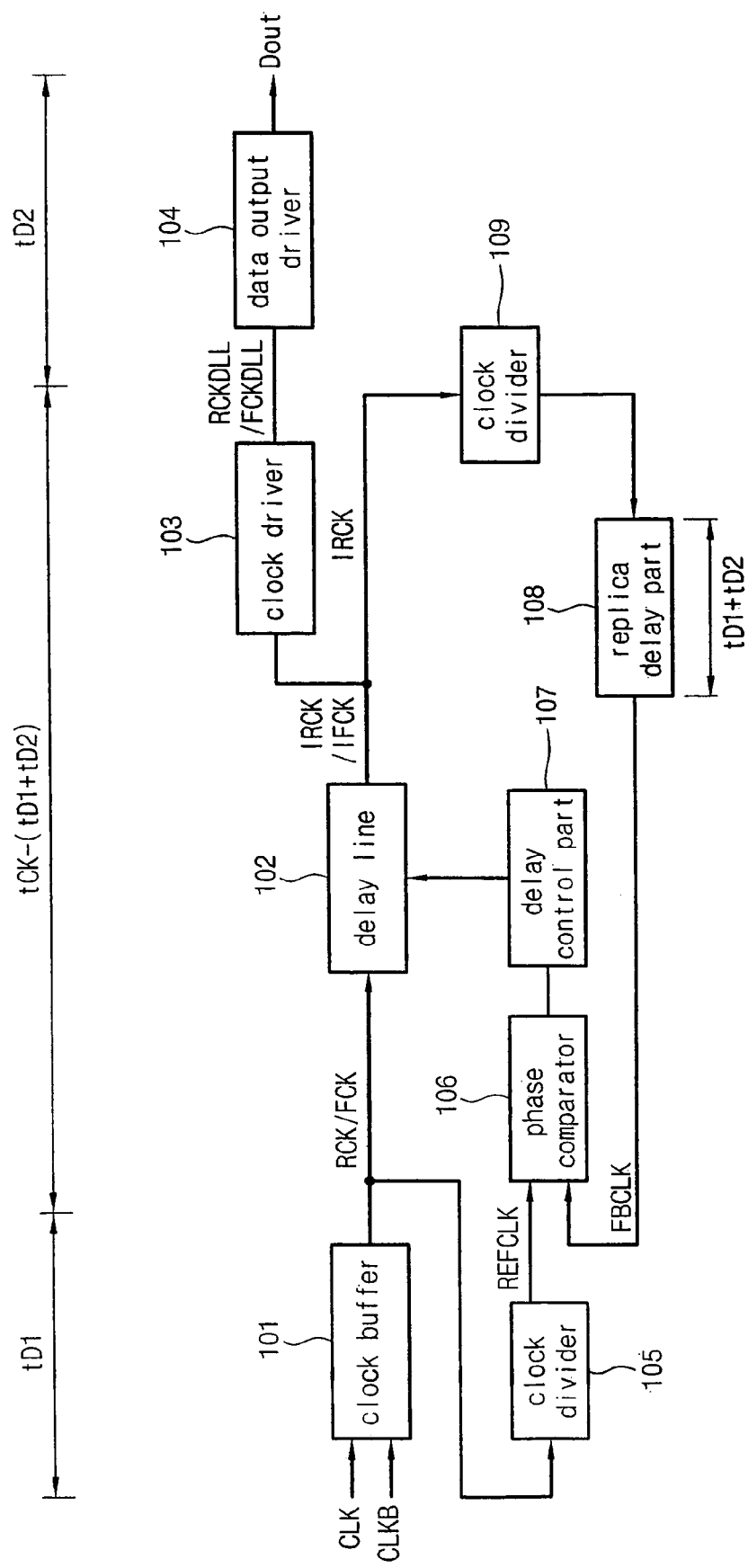
FIG. 1 is a block diagram of a typical delay locked loop circuit.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2:
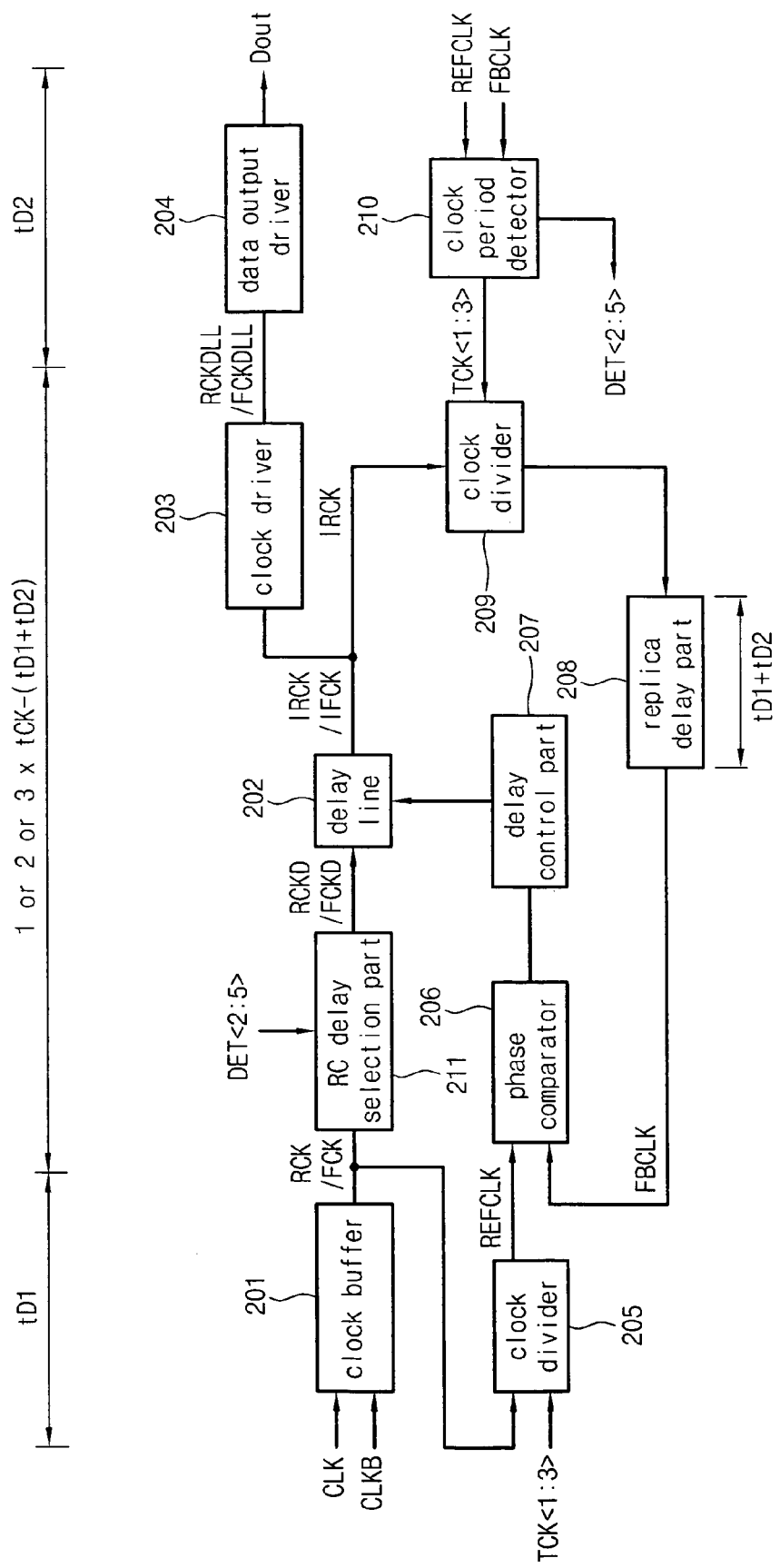
FIG. 2 is a block diagram of a delay locked loop circuit according to the present invention.

FIG. 2 illustrates an example of a delay locked loop circuit according to the present invention.

As shown in FIG. 2, the delay locked loop circuit according to the present invention includes a clock buffer 201 for receiving external clock signals CLK and CLKB, an RC delay selecting part 211 for receiving an output signal of the clock buffer 201 and delaying RC, a delay line 202 for receiving an output signal RCKD or FCKD of the RC delay selection part 211, a clock divider 205 for dividing an output signal of the clock buffer 201, a clock divider 209 for dividing an output signal (IRCK) from among output signals IRCK and IFCK of the delay line 202, a replica delay part 208 for delaying an output signal of the clock divider 209 by a predetermined time tD1+tD2, a phase comparator 206 for comparing a phase of an output signal FBCLK outputted from the replica delay part 208 with a phase of an output signal REFLK of the clock divider 205, a delay control part 207 for controlling a delay time of the delay line 202 by receiving an output signal of the phase comparator 206, a clock driver 203 for receiving an output signal IRCK or IFCK of the delay line 202, and a clock period detector 210 for receiving the output signal of the clock divider 205 and the output signal of the replica delay part 208 and outputting a first control signal group and a second control signal group.

Since functions and structures of the clock buffer 201, the delay line 202, the clock driver 203, the data output driver 204, the phase comparator 206, the delay control part 207, the replica delay part 208 shown in FIG. 2 are identical to those shown in FIG. 1, overlapping description will be omitted.

As shown in FIG. 2, the clock divider 205 receives only the RCK signal from among output signals of the clock buffer 201. The RCK signal applied to the clock divider 205 is delayed by a predetermined time by a signal TCK<1:3> applied to the clock divider 205. The signal TCK<1:3> is outputted from the clock period detector 210 shown in FIG. 3 to be described later.

The clock divider 209 receives only the IRCK signal from among output signals of the delay line 202. The IRCK signal is delayed by a predetermined time using the signal TCK<1:3> applied to the clock divider 209.

The delay locked loop circuit shown in FIG. 2 according to the present invention further includes the clock period detector 210 for detecting a period of the external clock signal CLK. Signals applied to the clock dividers 205 and 209 are divided by the control signal TCK<1:3> outputted from the clock period detector 210, after delaying the signals by a predetermined time. A delay time of the RC delay selection part 211 is determined by a control signal DET<1:5> outputted from the clock period detector 210.

Hereinafter, description about the clock period detector 210 will be given.

Figure 3:
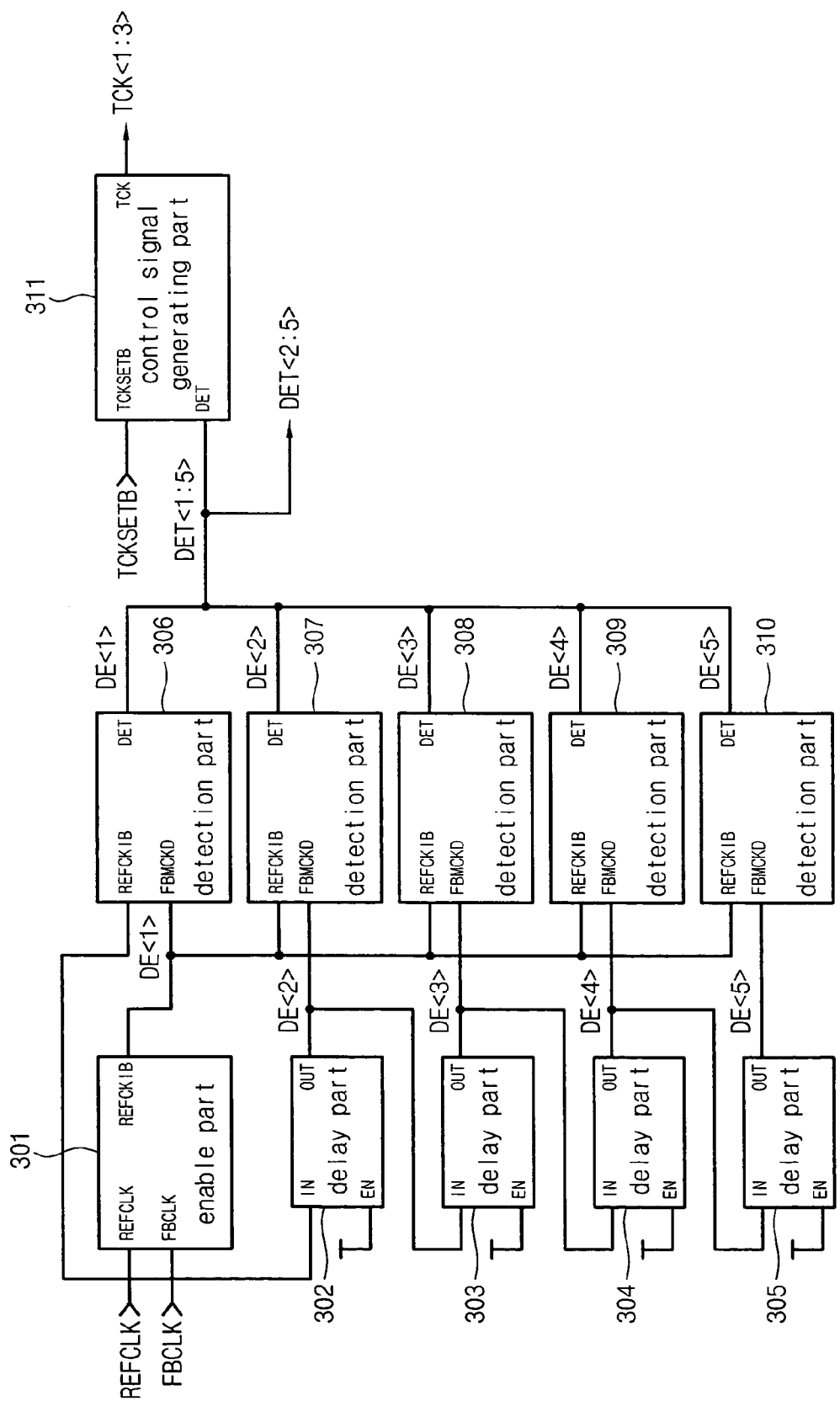
FIG. 3 illustrates an example of a clock period detector shown in FIG. 2.

FIG. 3 illustrates an embodiment of the clock period detector 210 shown in FIG. 2. The clock period detector 210 according to the present invention operates only when the delay locked loop circuit initially operates. Also, the clock period detector 210 detects a clock period and outputs a plurality of detection signals DET<1:5>.

As shown in FIG. 3, the clock period detector includes an enable part 301, delay parts 302 to 305, detection units 306 to 310, and a control signal generating part 311.

The enable part 301 outputs a signal for enabling operations of the detection units 306 to 310. As shown in FIG. 3, the enable part 301 receives an output signal REFCLK of the clock divider 205 and an output signal FBCLK of the replica delay part 208, so as to output a signal DE<1> by means of an output port REFCKIB.

The delay part 302 receives the output signal FBCLK of the replica delay part 208 and outputs a signal DE<2> by means of an output port (out) after delaying the signal by a predetermined time.

The delay part 303 receives the output signal DE<2> of the delay part 302 and outputs a signal DE<3> by means of an output port (out) after delaying the signal by a predetermined time.

The delay part 304 receives the output signal DE<3> of the delay part 303 and outputs a signal DE<4> by means of an output port (out) after delaying the signal by a predetermined time.

The delay part 305 receives the output signal DE<4> of the delay part 304 and outputs a signal DE<5> by means of an output port (out) after delaying the signal by a predetermined time.

Figure 5:
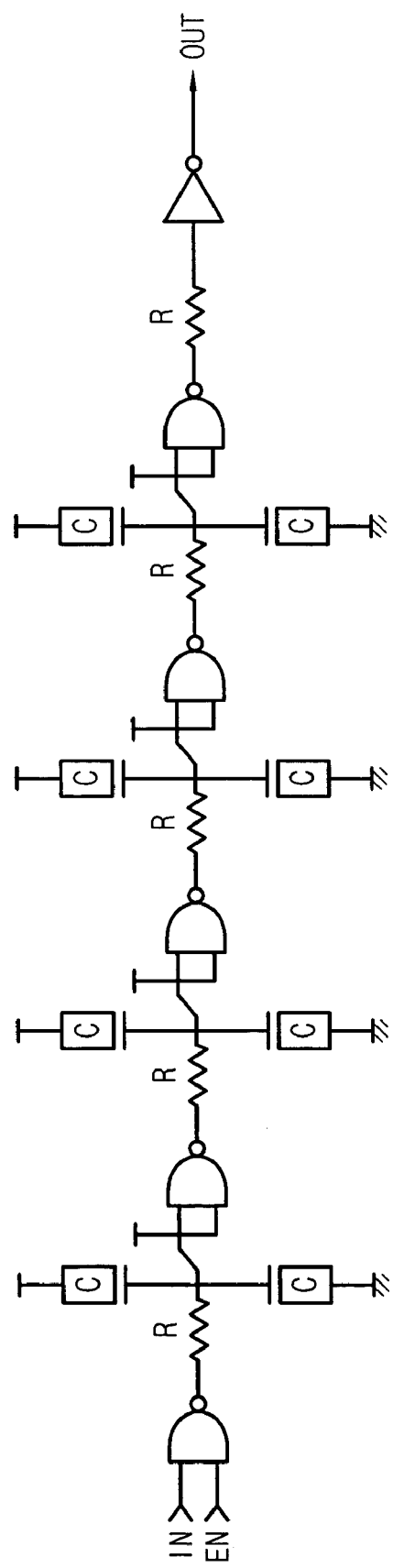
FIG. 5 illustrates an example of a delay circuit used for delay parts shown in FIG. 3.

The delay parts 302 to 305 have the same structure, and a detailed embodiment of each delay part is shown in FIG. 5.

The detection unit 306 compares the output signal DE<1> of the enable part 301 with the output signal REFCLK of the clock divider 205 and outputs a detection signal DET<1>.

The detection unit 307 compares the output signal DE<1> of the enable part 301 with the output signal DE<2> of the delay part 302 and outputs a detection signal DET<2>.

The detection unit 308 compares the output signal DE<1> of the enable part 301 with the output signal DE<3> of the delay part 303 and outputs a detection signal DET<3>.

The detection unit 309 compares the output signal DE<1> of the enable part 301 with the output signal DE<4> of the delay part 304 and outputs a detection signal DET<4>.

The detection unit 310 compares the output signal DE<1> of the enable part 301 with the output signal DE<5> of the delay part 305 and outputs a detection signal DET<5>.

The control signal generating part 311 receives the output signals DET<1:5> of the detection units 306 to 310 and outputs the signal TCK<1:3> for controlling the clock divider 209. As shown in FIG. 3, a signal TCKSETB is a setting signal for controlling an operation of the control signal generating part 311. That is, the external clock signal having a period of 10 to 20 ns enables the signal TCK 1, the external clock signal having a period of 3.75 to 10 ns enables the signal TCK 2, the external clock signal having a period of 2 to 3.75 ns enables the signal TCK3. An initial default signal outputted from the control signal generating part 311 is the signal TCK2.

As described above, the output signal TCK<1:3> of the control signal generating part 311 delays signals applied to the clock dividers 205 and 209 by a predetermined time.

That is, when the signal TCK1 is enabled, the clock dividers delay applied signals RCK and IRCK by 3tCLK (tCLK denotes a period of the CLK), and divide the applied signals. When the signal TCK2 is enabled, the clock dividers delay applied signals RCK and IRCK by 2tCLK, and divide the applied signals. When the signal TCK3 is enabled, the clock dividers delay applied signals RCK and IRCK by tCLK, and divide the applied signals. Although a procedure for generating the signals TCK<1:3> is described in the specification providing that the clock dividers 205 and 209 employ three delay periods, this can be changed.

Figure 4:
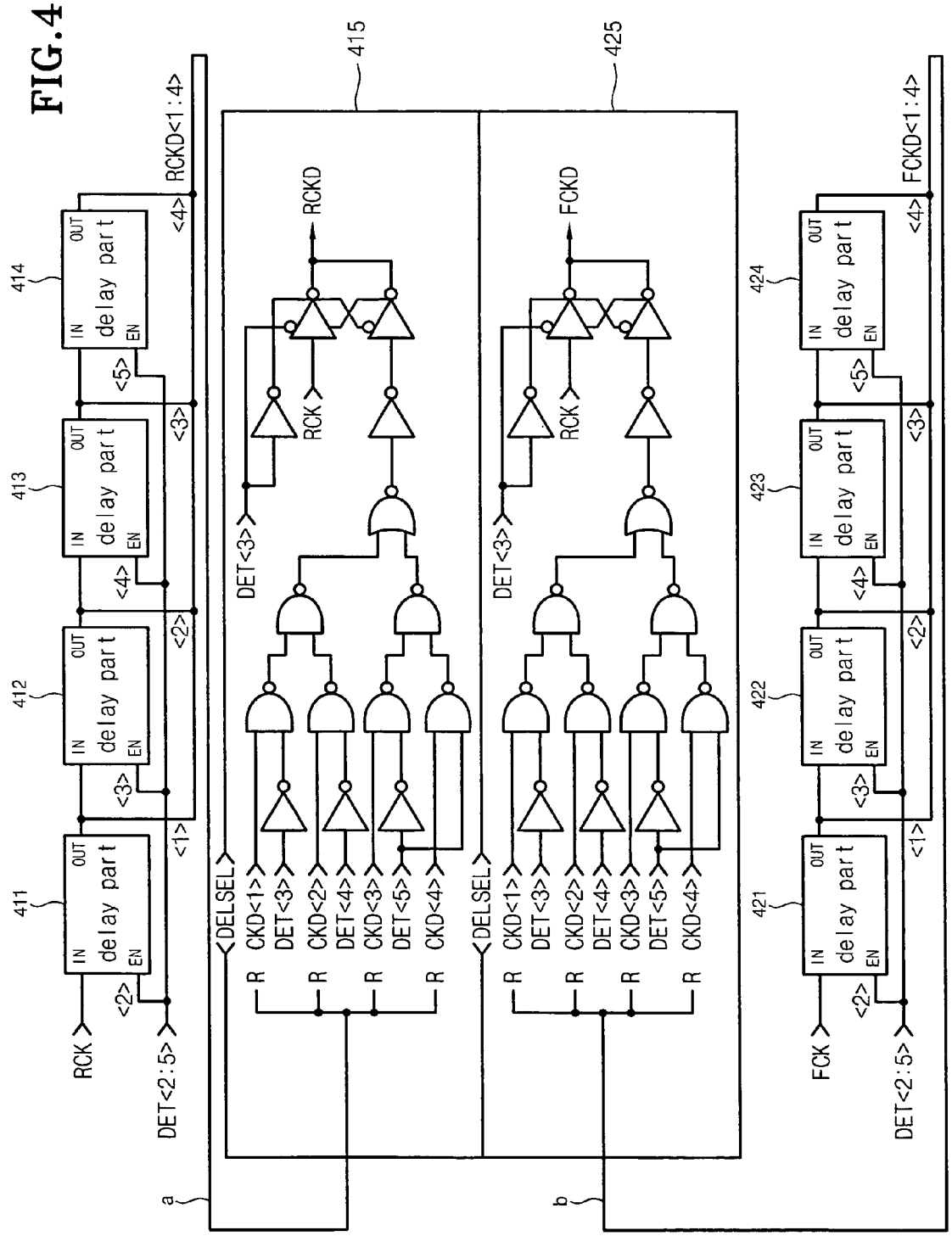
FIG. 4 illustrates an RC delay selection part according to one embodiment of the present invention.

FIG. 4 illustrates the RC selection part 211 shown in FIG. 4 according to one embodiment of the present invention.

As shown in FIG. 4, a delay part 411 receives a signal RCK and outputs the signal RCK after delaying the signal RCK by a predetermined time. Herein, the signal RCK is an output signal of the clock buffer 201 shown in FIG. 2. The delay part 411 operates when a detection signal DET<2> is enabled. An output signal of the delay part 411 is marked as "RCKD<1>".

A delay part 412 receives the output signal of the delay part 411 and outputs the output signal after delaying the output signal by a predetermined time. The delay part 412 operates when a detection signal DET<3> is enabled. An output signal of the delay part 412 is marked as "RCKD<2>".

A delay part 413 receives the output signal of the delay part 412 and outputs the output signal after delaying the output signal by a predetermined time. The delay part 413 operates when a detection signal DET<4> is enabled. An output signal of the delay part 413 is marked as "RCKD<3>".

A delay part 414 receives the output signal of the delay part 413 and outputs the output signal after delaying the output signal by a predetermined time. The delay part 414 operates when a detection signal DET<5> is enabled. An output signal of the delay part 414 is marked as "RCKD<4>".

Accordingly, a signal outputted to a node 'a' is a signal RCKD<1:4>obtained after the signal RCK is delayed by a predetermined time.

A selection part 415 is a circuit which outputs a signal RCKD by combining the signal RCKD<1:4> applied through the node 'a', a detection signal DET<2:5>, and an output signal RCK of the clock buffer 201.

As shown in FIG. 4, a delay part 421 receives a signal FCK and outputs the signal FCK after delaying the signal RCK by a predetermined time. Herein, the signal FCK is an output signal of the clock buffer 201 shown in FIG. 2. The delay part 421 operates when a detection signal DET<2> is enabled. An output signal of the delay part 421 is marked as "FCKD<1>".

A delay part 422 receives the output signal of the delay part 421 and outputs the output signal after delaying the output signal by a predetermined time. The delay part 421 operates when a detection signal DET<3> is enabled. An output signal of the delay part 422 is marked as "FCKD<2>".

A delay part 423 receives the output signal of the delay part 422 and outputs the output signal after delaying the output signal by a predetermined time. The delay part 423 operates when a detection signal DET<4> is enabled. An output signal of the delay part 423 is marked as "FCKD<3>".

A delay part 424 receives the output signal of the delay part 423 and outputs the output signal after delaying the output signal by a predetermined time. The delay part 424 operates when a detection signal DET<5> is enabled. An output signal of the delay part 424 is marked as "FCKD<4>".

Accordingly, a signal outputted to a node 'b' is a signal FCKD<1:4> obtained after the signal FCK is delayed by a predetermined time.

A selection part 425 is a circuit, which outputs a signal FCKD by combining the signal FCKD<1:4> applied through the node 'b', a detection signal DET<2:5>, and an output signal FCK of the clock buffer 201.

Generally, the delay parts shown in FIG. 4 include a plurality of RC circuits connected to each other in series. In particular, the delay parts may include circuits shown in FIG. 5. In this case, a delay time of an RC delay circuit is adjusted according to a frequency of an external clock signal.

As understood with reference to FIG. 4, the RC delay selection part is a circuit for delaying the output signal of the clock buffer 201 by a predetermined time using an output signal DEG<2:5> of the clock period detector. As a result, the delay time of the RC delay section part is determined by a detection signal outputted from the clock period detector 210.

That is, after detecting a period of the external clock signal, the clock period detector according to the present invention previously changes a phase of a clock signal applied to the delay line 202 using the detected period so that two signals compared with each other in the phase comparator 206 are quickly synchronized with each other within allowance. Herein, the delay locked loop circuit according to the present invention adjusts a coarse delay through the RC delay selection part 211. Thereafter, the delay locked loop circuit adjusts a fine delay through the delay line 202.

FIG. 5 illustrates an example of a delay circuit used for the delay parts 302 to 305 shown in FIG. 3. As shown in FIG. 5, it can be understood that a delay time is adjusted by using resistors and capacitors. As described above, an influence on the delay circuit according to PVT (processes, voltage, temperature) can be reduced through the usage of resistors and capacitors.

As described above, according to the present invention, the clock period detector is provided so as to detect a period of a clock, the RC delay selection part uses the detection information so as to adjust a coarse delay according to the length of a clock signal period, and the delay line adjusts a fine delay. As a result, since the RC delay selection part adjusts a coarse delay, the number of unit delay circuits included in the delay line can be reduced and fast locking can be quickly performed. Also, since delay periods of the clock dividers 205 and 209 are determined by a control signal TCK<1:3> outputted from the clock period detector, a delay locked loop circuit operable through a wide range of frequencies can be realized.

As described above, according to the present invention, the delay locked loop can quickly perform normal functions. Also, a high integrated circuit can be realized by reducing an area of the delay line. Also, since the delay locked loop circuit is realized suitably for a wide range of frequencies, the delay locked loop circuit can be practically employed for next generation memories such as DDR2 SDRAMs in a high-speed frequency operation.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A delay locked loop circuit comprising:
    a clock buffer for receiving an external clock signal;
    a delay selection part for receiving an output signal of the clock buffer, delaying the output signal by a predetermined time, and outputting the output signal;
    a delay line for receiving an output signal of the delay selection part, delaying the output signal by a predetermined time, and outputting the output signal;
    a first clock divider for dividing a frequency of the output signal of the clock buffer at the ratio of 1/n (n=a natural number of at least two);
    a second clock divider for dividing a frequency of the output signal of the delay line at the ratio of 1/n;
    a replica delay part for delaying an output signal of the second divider by a predetermined time;
    a phase comparator for comparing a phase of an output signal of the first divider with a phase of an output signal of the replica delay part;
    a delay controller for adjusting a delay time of the delay line in response to an output signal of the phase comparator; and
    a clock period detector for receiving the output signal of the first clock divider and the output signal of the replica delay part and outputting a first control signal group and a second control signal group,
    wherein the first control signal group is applied to the first clock divider and the second clock divider so as to delay signals applied to the first clock divider and the second clock divider, and wherein the second control signal group is applied to the delay selection part so as to adjust a delay time of the delay selection part.

2. The delay locked loop circuit as claimed in claim 1, wherein, when a frequency of the external clock signal is within a reference frequency range, the first clock divider and the second clock divider controlled by the first control signal group divide signals applied to the first clock divider and the second clock divider after delaying the signals by a first delay time.

3. The delay locked loop circuit as claimed in claim 2, wherein, when the frequency of the external clock signal is higher than the reference frequency range, the first clock divider and the second clock divider divide signals applied to the first clock divider and the second clock divider after delaying the signals by a second delay time shorter than the first delay time, and, when the frequency of the external clock signal is lower than the reference frequency range, the first clock divider and the second clock divider divide signals applied to the first clock divider and the second clock divider after delaying the signals by a third delay time longer than the first delay time.

4. The delay locked loop circuit as claimed in claim 1, wherein the higher the frequency of the external clock signal is as compared with a reference frequency range, the longer the delay time of the delay selection part determined by the second control signal group is, and the lower the frequency of the external clock signal is as compared with the reference frequency range, the shorter the delay time of the delay selection part determined by the second control signal group is.

5. A delay locked loop circuit comprising:
a clock buffer for receiving an external clock signal;
a delay selection part for receiving an output signal of the clock buffer and delaying and outputting the output signal in response to input of a predetermined clock period detecting signal;
a delay line for receiving an output signal of the delay selection part and outputting the output signal after a fine delay;
a first clock divider for dividing a frequency of the output signal of the clock buffer;
a second clock divider for dividing a frequency of the output signal of the delay line;
a replica delay part for delaying an output signal of the second clock divider by a predetermined time;
a phase comparator for comparing a phase of an output signal of the first clock divider with a phase of an output signal of the replica delay part;
a delay control part for adjusting a delay time of the delay line in response to an output signal of the phase comparator; and
a clock period detector for receiving the output signal of the first clock divider and the output signal of the replica delay part and outputting the clock period detecting signal.

6. The delay locked loop circuit as claimed in claim 5, wherein the clock period detector includes a control signal generating part for receiving the clock period detecting signal and a predetermined setting signal and outputting a control signal for controlling delay periods of the first clock divider and the second clock divider.

7. The delay locked loop circuit as claimed in claim 6, wherein the first clock divider determines the delay period in response to input of the control signal.

8. The delay locked loop circuit as claimed in claim 6, wherein the second clock divider determines the delay period in response to input of the control signal.

9. The delay locked loop circuit as claimed in claim 6, wherein the clock period detector further includes:
an enable part for receiving the output signal of the first clock divider and the output signal of the replica delay part;
a plurality of delay parts for outputting a plurality of delay signals; and
a detection unit for outputting the clock period detecting signal in response to input of output signals of the enable part and the delay parts.

10. The delay locked loop circuit as claimed in claim 9, wherein the delay parts include an RC delay part.

* * * * *